United States Patent

[11] 3,620,932

[72] Inventors Joan M. Crishal
Torrance;
Edward J. Rice, Los Angeles, both of Calif.
[21] Appl. No. 821,867
[22] Filed May 5, 1969
[45] Patented Nov. 16, 1971
[73] Assignee TRW Semiconductors Inc.
Lawndale, Calif.

[54] BEAM LEADS AND METHOD OF FABRICATION
19 Claims, 7 Drawing Figs.

[52] U.S. Cl. .......... 204/15, 29/580, 29/590, 117/212, 317/234 R
[51] Int. Cl. .......... C23b 5/48
[50] Field of Search .......... 204/15; 117/212; 317/234 R; 29/580, 590

[56] References Cited

UNITED STATES PATENTS

| | | | |
|---|---|---|---|
| 3,388,048 | 6/1968 | Szabo | 204/15 |
| 3,421,985 | 1/1969 | Baker, et al | 204/15 |
| 3,449,825 | 6/1969 | Lord | 204/40 |
| 3,462,349 | 8/1969 | Gorgenyi | 204/15 |
| 3,507,756 | 4/1970 | Wenger | 204/15 |

*Primary Examiner*—John H. Mack
*Assistant Examiner*—T. Tufariello
*Attorney*—Spensley, Horn & Lubitz

ABSTRACT: A beam lead for a semiconductor device and a method of fabricating the beam lead thereon. A semiconductor wafer is provided, a plurality of semiconductor devices being disposed thereon, with a line being scribed between the semiconductor devices. Element images are formed upon the devices by photolithographic techniques and a metal layer deposited on the wafer making contact with the metal contacts of the devices. Thick metal leads are deposited upon the metal layer and an etchant is used to isolate the beam leads after which all photosensitive material is stripped away.

INVENTORS.
JOAN M. CRISHAL,
EDWARD J. RICE,
By THEIR ATTORNEYS.
Spensley & Horn.

INVENTORS.
JOAN M. CRISHAL,
EDWARD J. RICE,

By THEIR ATTORNEYS
Spensley & Horn.

BEAM LEADS AND METHOD OF FABRICATION

BACKGROUND OF THE INVENTION

1. Field of the Invention

The present invention beam lead and method of fabrication relates generally to the field of semiconductor contacts, but more specifically to semiconductor contacts and the fabrication technology utilized to solve the problems arising out of high frequency and high power operation.

2. Prior Art

With the advancement in semiconductor technology, the need for devices which can operate at high frequency and high-power levels has resulted in increased attention being focused on the methods of fabricating semiconductor contacts and the resulting products thereof. Thin film techniques of the prior art have demonstrated methods capable of producing devices which operate quite adequately under conditions of low-signal frequency and low-power levels. The prior art did not solve problems of increased lead inductance under high-frequency conditions or excessive lead resistance under conditions of high-power operation.

The fabrication of beam leads is known in the prior art, but the techniques taught by the prior art created problems which have not been solved, both as to the method and final product. The method taught by the prior art deposited a thick metal lead directly on a passivating layer. This resulted in the need to etch the semiconductor wafer from the back side of the wafer in order to separate the semiconductor devices. The etching was done from the backside of the wafer to prevent damage to the devices, but the alignment of the wafer was critical. In addition, the use of etching techniques required that the devices be farther apart because of the width of the etchant.

The present invention contact and method therefor solved the problems left unresolved by the prior art. The semiconductor wafer is scribed prior to the use of a photoresist layer. When the semiconductor wafer is ready to be divided, the devices can be separated by conventional ruling techniques, the wafer breaking along the scribed line. The use of etchant to separate the devices is eliminated by the present invention method, therefore the separation can be accomplished without use of difficult and time consuming alignment procedures.

SUMMARY OF THE INVENTION

It is an object of the present invention to provide an improved beam lead and an improved method to fabricate the beam leads on a semiconductor device.

It is another object of the present invention method to provide an improved method of fabricating beam leads on semiconductor devices whereby the devices can be separated without the use of back etching techniques.

It is still yet another object of the present invention to provide a method of fabricating beam leads wherein a layer of photoresist is used as a partitioning layer.

A semiconductor wafer is provided whereby all the devices on the semiconductor wafer have metal contacts connected to the active regions of devices, the metal contacts being fabricated in a conventional manner. The first step in the present invention method is to scribe lines through the passivating layer and into the semiconductor wafer. The scribe line is disposed between the semiconductor devices and in a position which will be under and preferably perpendicular to the beam leads being fabricated.

The second step in the present invention method is to deposit a layer of photoresist upon the surface of the semiconductor wafer. Using photolithographic techniques, portions of the layer of photoresist are dissolved exposing the metal contacts connected to the active regions of the semiconductor devices.

The next step in the present invention method is to deposit a thin metal layer on the entire surface of the semiconductor wafer. A second layer of photoresist is deposited upon the metal layer, the photoresist not covering the entire surface but defining the image of the beam leads. A thick metal layer is then plated on that part of the surface of the semiconductor wafer not covered by the second layer of photoresist, the plated layer defining beam leads.

A photoresist stripper is then applied to the second layer of photoresist dissolving the photoresist and exposing the thin metal layer. An etchant is then used to concurrently etch the thin metal layer, which was deposited on the first layer of photoresist, and the thick electroplated beam leads. Since the deposited metal layer is much thinner than the plated metal beam leads, the etchant will dissolve the exposed metal layer while leaving a substantial part of the plated metal intact.

The entire semiconductor wafer is placed in a photoresist stripper dissolving the first layer of photoresist. The action of the stripper creates an air space between the surface of the semiconductor wafer and the fabricated beam lead exposing the scribed lines. The semiconductor wafer is again scribed to completely define the semiconductor devices, the wafer then being divided by conventional rolling techniques.

Since the beam leads are not in contact with the passivating layer on the surface of the semiconductor wafer, the problems not solved by the prior art are avoided. Whereas the prior art required the use of back etching, and therefore complicated alignment procedure, the present invention method eliminates this problem. In addition, the use of back etching increases the distance between the semiconductor devices because of the width of the etchant. The present invention method gives a greater device yield by eliminating the separating etchant altogether.

The novel features which are believed to be characteristic of the present invention will be better understood from the following description considered in connection with the accompanying drawing in which a presently preferred embodiment of the invention is illustrated by way of example. It is to be understood that the drawing is for the purpose of illustration and description only, and not intended as a definition of the limits of the invention.

DESCRIPTION OF THE PRESENTLY PREFERRED EMBODIMENTS

Figure 1:
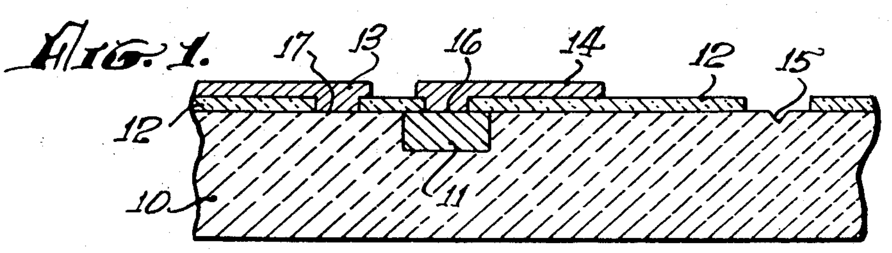
FIG. 1 is a partial cross section of a semiconductor wafer with a scribed line for division of the semiconductor wafer.

The present invention beam lead and method for fabricating same can be best understood by reference to the above mentioned figures. Referring now to FIG. 1, there is shown a partial cross section of a semiconductor wafer 10 upon the surface of which is disposed an active region 11. The semiconductor device can be any conventional device, FIG. 1 merely being for example only. The active region 11 has been created on the surface of the semiconductor wafer 10 by known methods. The particular method by which the active region 11 is formed is not a part of the present invention method but is shown for the purpose of describing a presently preferred embodiment. A passivating layer 12 is then formed on the surface of the semiconductor wafer 10, the passivating layer 12 formed by conventional methods, typically sputtering. The passivating layer 12 can be silicon dioxide, silicon nitride, or other conventional passivating layers. The passivating layer 12 is then subjected to conventional masking and etching techniques to provide access to the active region 11 and semiconductor wafer 10 at surfaces 16 and 17 respectively. A metal layer has been deposited on the semiconductor wafer 10 and passivating layer 12 to form metal contacts 13 and 14. The metal contacts are formed by conventional, known techniques. The metal used to form the metal contacts 13 and 14 is any conventional contact metal, but is preferably titanimum-gold or chromium-gold.

FIG. 1 is a partial cross section of a semiconductor wafer 10 have disposed upon it many semiconductor devices. Scribe line 15 represents many lines across the surface of the semiconductor wafer 10, the line to be used to separate the devices upon completion of the steps in accordance with the present invention method. The Scribe line 15 is inserted along the direction which will be under and perpendicular to the beam leads fabricated in accordance with present invention method, and in the example shown, perpendicular to the plane of the cross section.

Figure 2:
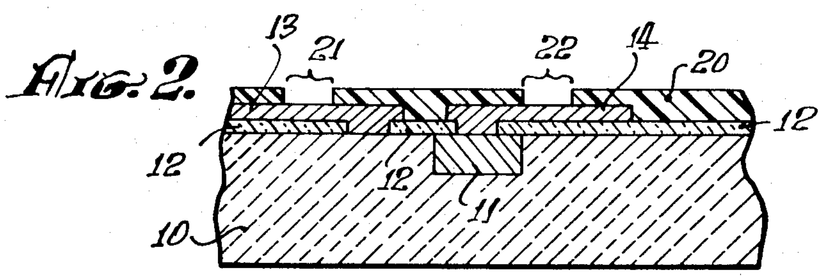
FIG. 2 is a partial cross section of a semiconductor wafer with element images formed in a layer of photosensitive material.

Referring now to FIG. 2, a first photoresist layer 20 is deposited upon the semiconductor wafer 10, contacting the metal contacts 13 and 14 and the passivating layer 12. The photoresist is a photosensitive material. When the material is subjected to an incident light source through a mask, the areas which are unexposed can be dissolved with known solvents. The solvents used to dissolve the photosensitive material are commercially known as developers. After a developer is applied to the first photoresist layer 20, the unexposed areas will be dissolved. In FIG. 2 the unexposed areas are represented by areas 21 and 22. A suitable photoresist layer 20 is Kodak Thin Film Resist manufactured by the Eastman Kodak Company. The first photoresist layer 20 is one that will be dissolved with conventional organic strippers. The areas 21 and 22 give access to metal contacts 13 and 14 respectively.

Figure 3:
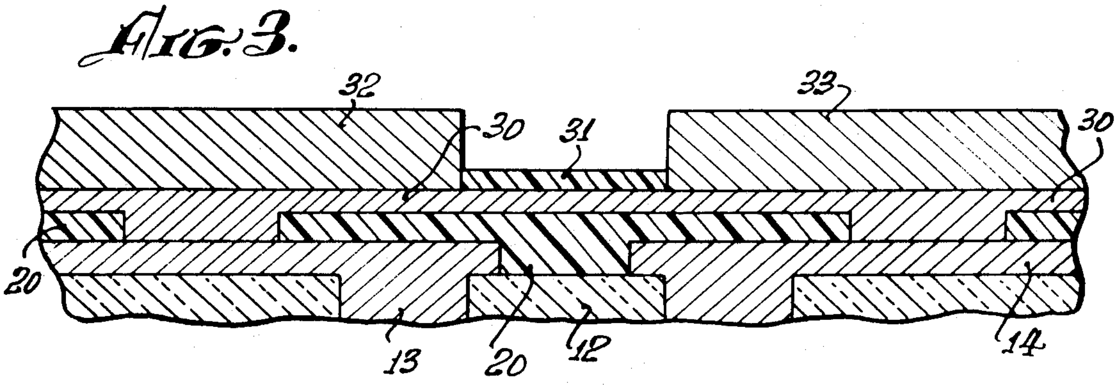
FIG. 3 is an enlarged partial cross section of the layers of metal and photoresist disposed on top of the semiconductor wafer in accordance with the present invention method.

FIG. 3 illustrates the result of the next three steps an embodiment of the present invention method. A thin metal layer 30 is disposed upon the entire surface of the first photoresist layer 20 and the exposed metal contacts 13 and 14. The metal layer 30 can be disposed by known methods, typically vacuum evaporation. The metal layer 30 is compatible with the metal contacts 13 and 14, and is preferably nichrome-gold or nichrome-nickel. The next step in the present invention method is to deposit a second photoresist layer 31 on the surface of the metal layer 30 by photolithographic techniques. The second photoresist layer 31 is thin film photoresist, but will be of the type which can be dissolved easier and at a faster rate than the first photoresist layer 30. The second photoresist layer 31 is preferably Shipley A. Z. resist. The Shipley A. Z. resist, when unexposed, can be removed by acetone without substantially affecting the first photoresist layer 20. The second photoresist layer 31 is obtained through the use of conventional masking techniques whereby the resulting second photoresist layer 31 does not cover the entire surface of metal layer 30, but defines the shape of the beam leads being fabricated.

As shown in FIG. 3, the thick metal leads 32 and 33 are then disposed upon the metal layer 30. The relative dimensions of the thick metal leads 32 and 33 and the metal layer 30, as shown in FIG. 3, are for the purpose of illustration only and not intended to depict actual proportions. The thickness of the metal leads 32 and 33 will be substantially greater than that of the metal layer 30, where substantially greater is understood to mean at least twice as thick. The method by which the thick metal leads 32 and 33 are disposed upon the metal layer 30 can be any of several known conventional techniques. Because of the capabilities of depositing thick layers of metal, the metal leads 32 and 33 will preferably be formed by electroplating. Since the metal layer 30 and the metal leads 32 and 33 are connected, the metal used for metal leads 32 and 33 will be compatible with that used for the metal layer 30. For example, where the metal layer 30 is nichrome-gold, metal leads 32 and 33 will preferably be gold. As an alternative to an electroplating process, the metal leads 32 and 33 could be formed by vacuum evaporation through a metal or photoresist mask.

As an alternative to the steps of depositing the second photoresist layer 31 and electroplating metal leads 32 and 33 on the surface not covered with photoresist, a conventional etching procedure could be utilized. The entire surface of the metal layer 30 can be electroplated with a thick layer of metal intended for fabrication of the beam leads. A layer of photoresist could then be deposited on the plated surface, the photoresist being exposed to an incident light source through a mask. The mask would expose those areas intended for the beam leads, leaving unexposed to the areas to be dissolved. When a photoresist developer is applied to the photoresist layer, the unexposed areas will be dissolved leaving the plated metal exposed. An etchant consistent with the plated metal is then used to etch away the unwanted metal. Although this is an alternative procedure, the steps discussed above are preferable because of the problems of mask alignment and control of the etching procedures.

Figures 4, 5:
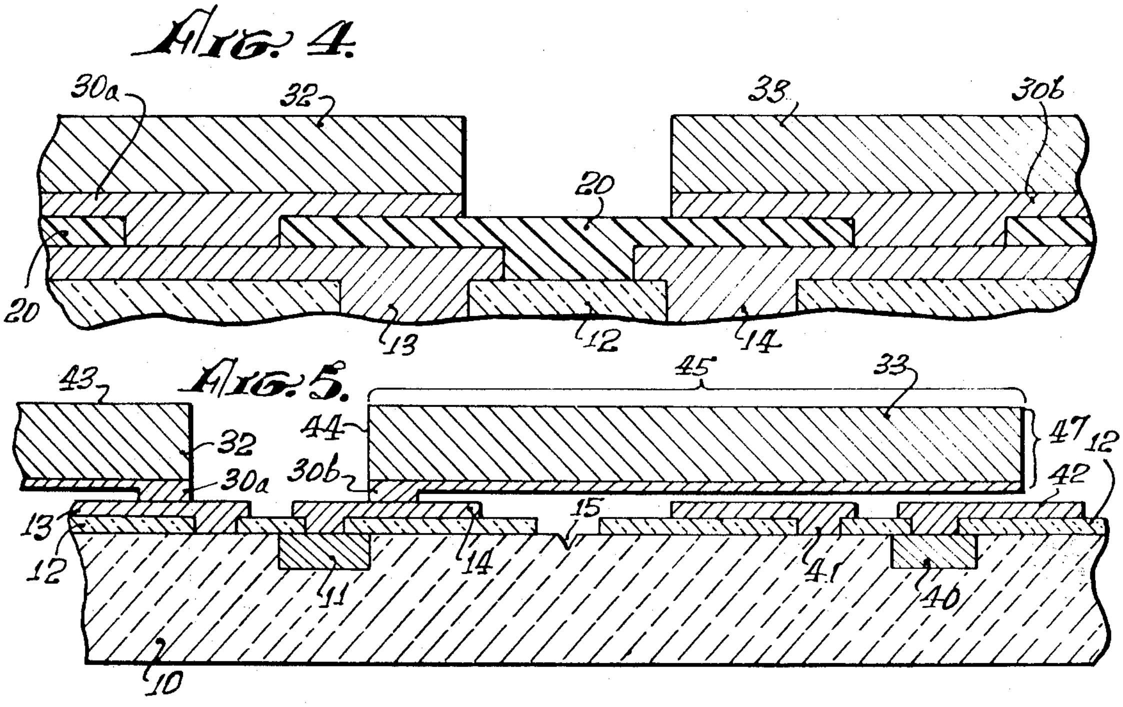
FIG. 4 is an enlarge partial cross section of that shown in FIG. 3 after a photoresist stripper an metal etchant are applied in accordance with the present invention method.
FIG. 5 is a partial cross section of a semiconductor wafer after being processed in accordance with an embodiment of the present invention method.

The results obtained by proceeding with the present invention method can be best seen by reference to FIG. 4. As discussed previously, the photoresist layer 31 was selected for its properties which insure that it will be dissolved without affecting the first photoresist layer 20. The second photoresist layer 31 is subjected to an adequate stripper, preferably acetone. When the photoresist layer 31 is removed, the surface of metal layer 30 is exposed.

The next step in the present invention method is to etch the metal layer 30 to isolate the metal leads 32 and 33. Until metal layer 30 is etched, the metal leads 32 and 33 will remain in electrical contact with each other. An etchant which can etch metal layer 30 is applied to the surface of the metal layer 30 and to the metal leads 32 and 33. Since the two metal beams are themselves able to be connected, the etchant will typically react and dissolve both. The etchant will concurrently attack both the metal layer 30 and the metal leads 32 and 33, but the metal layer 30 is much thinner, it will be dissolved faster leaving a substantial part of the metal leads 32 and 33 intact. This step of the present invention method eliminates the problem of selective etching. By selecting an etchant which will attack both the metal layers 30 and the metal leads 32 and 33 concurrently, use can be made of the fact that the thickness of the two is substantially different. Because of the difference in the thickness, the metal layer 30 will be etched away leaving a large portion of the metal leads 32 and 33 remaining.

Referring now to FIG. 4, the metal layer 30 is dissolved leaving exposed the surface of the first photoresist layer 20. The metal leads 32 and 33 are now electrically isolated from each other being disposed upon and electrically connected to the metal layers 30*a* and 30*b* respectively. The thickness 47 of metal leads 32 and 33, after use of the etchant, is typically 0.2 to 0.4 mils.

Since an object of the present invention method is to provide a method whereby the semiconductor devices can be separated by conventional rolling techniques, the first photoresist layer 20 must be removed. The entire semiconductor wafer 10 is subjected to a photoresist stripper thereby removing the first photoresist layer 20. Referring now to FIG. 5, a partial cross section of the processed semiconductor wafer 10 and present invention beam lead structure is shown therein, the area shown being larger than that of FIGS. 1, 2, 3 and 4. It can be seen that the composite beam lead 43 is composed of metal layer 30*a* and the electroplated metal lead 32; the composite beam lead 44 is composed of metal layer 30*b* and the electroplated metal lead 33. The present invention structure and method for fabricating that structure utilizes a typical semiconductor wafer 10, therefore the length 45 of the beam lead 44 will interfere with other of the semiconductor devices disposed upon the semiconductor wafer 10. In FIG. 5 it can be seen that the composite beam lead 44 extends over the adjacent semiconductor device. Since the composite beam lead 44 is totally separated from the metal contacts 41 and 42 and the active region 40 of the adjacent semiconductor device, upon separation of the devices two independent devices will be yielded. Of the two semiconductor devices shown in FIG. 5, one (the present invention structure) will have composite beam leads 43 and 44 and the other will have conventional metal contacts 41 and 42. The length 45 of beam lead 44 is approximately 30 mils.

After the first photoresist layer 20 is stripped away, the semiconductor wafer 10 is prepared for division. In the example shown in FIG. 5, the scribe line 15 was inserted prior to the deposition of the first photoresist layer 20, scribe line 15 for division of the semiconductor wafer 10 along an axis perpendicular to the cross section shown therein. If it is assumed that the semiconductor wafer 10 has a finite dimension in a direction perpendicular to the cross section area shown in FIG. 5, scribe lines must be inserted into the semiconductor wafer 10 along an axis consistent with the orientation of other semiconductor devices being disposed upon the semiconductor wafer 10. After insertion of all scribe lines is completed, the semiconductor wafer 10 can be divided into the individual semiconductor devices by conventional rolling techniques. The present invention method has avoided the problem of back etching by using the first photoresist layer 20 as a partition. If the composite beam lead 44 was affixed to the top surface of the semiconductor wafer 10, a etchant would have to be applied to the bottom surface 46 of the semiconductor wafer 10 to separate the semiconductor devices. The problems inherent in the alignment of the semiconductor wafer 10 to separate the semiconductor wafer 10 and the physical width of the etchant cut are eliminated by the present invention method.

Figure 6:
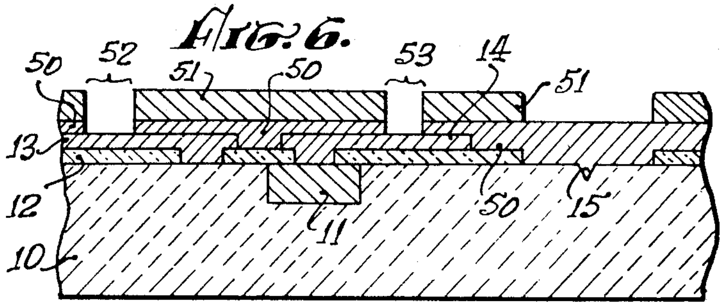
FIG. 6 is a partial cross section of a semiconductor wafer having element images formed in a passivating layer.

A result of an alternative embodiment of the present invention method is illustrated in FIG. 6. It can be seen in FIG. 5 that the metal contacts 13 and 14 of the semiconductor device remain exposed after stripping away the first photoresist layer 20 in accordance with the described embodiment of the present invention method. Referring now to FIG. 6, after the semiconductor wafer 10 is scribed with scribe line 15, a second passivating layer 50 is disposed upon the surface of the semiconductor wafer 10. The second passivating layer 50 is deposited by conventional methods. The second passivating layer 50 is typically silicon dioxide or silicon nitride. A first layer of thin film photoresist 51 is then deposited upon the second passivating layer 50, and element images are formed in the photoresist layer 51 utilizing conventional photolithographic techniques. The second passivating layer 50 is then etched by a conventional etchant to form areas 52 and 53 giving access to metal contacts 13 and 14. The remainder of this embodiment of present invention method is identical with that previously discussed, the process being resumed at the step requiring deposition of the thin metal layer 60 over the entire surface of the semiconductor wafer 10.

Figure 7:
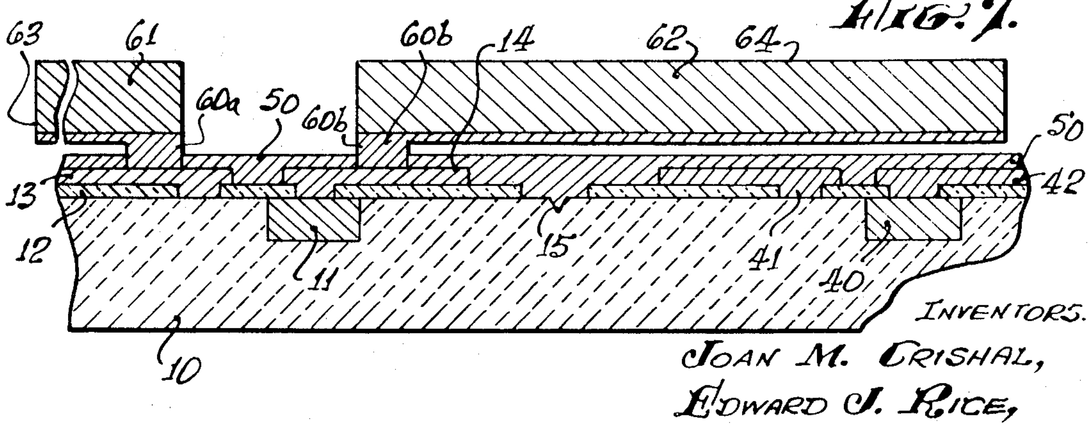
FIG. 7 is a partial cross section of a semiconductor wafer after being processed in accordance with another embodiment of the present invention method.

Referring now to FIG. 7 an embodiment of the present invention beam lead structure made in accordance with an alternative embodiment of the present invention method is shown therein. The second passivating layer 50 fully covers the metal contacts 13 and 14 thereby eliminating the possibility of accidentally touching the contacts with the composite beam 64 or any other electrically conducting surface. The composite beam 64 is composed of the metal layer **60*a* and the electroplated metal lead 61; composite beam lead 54 is composed of the metal layer 60*b* and the electroplated metal lead 62**.

What is claimed is:

1. A method for fabricating beam leads on a semiconductor device, comprising the steps of:

a. providing a semiconductor wafer with a semiconductor device being disposed thereon, said semiconductor device having a metal contact for contacting a predetermined region of said semiconductor device;
b. scribing a line upon said semiconductor wafer adjacent to said semiconductor device;
c. depositing a layer of photosensitive means for defining element images upon said semiconductor device and photolithographically defining an element image in said layer of photosensitive means;
d. depositing a metal layer on said layer of photosensitive means, said metal layer contacting said metal contact adjacent to said element image;
e. depositing a metal lead of given geometry on said metal layer;
f. dissolving portions of said metal layer and said metal lead until said layer of photosensitive means is exposed; and
g. dissolving said photosensitive means.

2. A method as in claim 1 wherein said photosensitive means is photoresist.

3. A method as in claim 1 wherein the thickness of said metal lead is substantially greater than that of said metal layer.

4. A method as in claim 1 wherein said metal lead is deposited by electroplating.

5. A method for fabricating beam leads on a semiconductor device comprising the steps of:

a. providing a semiconductor wafer having a plurality of semiconductor devices being disposed thereon, each of said plurality of semiconductor devices having metal contacts contacting predetermined regions of said semiconductor device;
b. scribing lines on said semiconductor wafer between predetermined ones of said semiconductor devices;
c. depositing a first layer of photosensitive means for defining element images on said semiconductor device and photolithographically defining a plurality of element images in said first layer of photosensitive means;
d. depositing a metal layer on said first layer of photosensitive means, said metal layer contacting said metal contacts adjacent said plurality of element images;
e. depositing a second layer of photosensitive means for defining element images on predetermined areas of said metal layer to enable definition of a predetermined geometrical shape having a predetermined depth;
f. depositing metal leads on portions of said metal layer devoid of said second layer of photosensitive means;
g. dissolving said second layer of photosensitive means;
h. dissolving portions of said metal layer and said metal leads until said first layer of photosensitive means is exposed; and
i. dissolving all of said first layer of photosensitive means.

6. A method as in claim 5 wherein the said photosensitive means is photoresist.

7. A method as in claim 5 wherein the thickness of said metal leads is substantially greater than that of said metal layer.

8. A method as in claim 5 wherein said metal leads are deposited by electroplating.

9. A method as in claim 5 wherein said second layer of photosensitive means dissolves at a faster rate than said first layer of photosensitive means.

10. A method as in claim 5 wherein said portions of said metal layer and said metal leads are dissolved concurrently.

11. A method for fabricating beam leads on a semiconductor device, comprising the steps of:

a. providing a semiconductor wafer having a top, bottom, and side surfaces, said semiconductor wafer having a plurality of semiconductor devices being disposed upon said top surface thereof, each of said plurality of semiconductor devices having metal contacts, contacting given regions of said semiconductor device;
b. scribing a line on said top surface of said semiconductor wafer, said scribed line aligned between given ones of said semiconductor devices;
c. depositing a first layer of photosensitive means for defining element images on said top surface of said semiconductor wafer and photolithographically defining a plurality of element images in said layer of photosensitive means to enable contacting said metal contacts of said plurality of semiconductor devices;

d. depositing a metal layer on said first layer of photosensitive means, said metal layer contacting said metal contacts adjacent to said plurality of element images;

e. depositing a second layer of photosensitive means on a portion of said metal layer, said means for defining a given geometrical shape upon said metal layer;

f. depositing metal leads on that portion of said metal layer devoid of said second layer of photosensitive means;

g. dissolving said second layer of photosensitive means exposing said metal layer;

h. dissolving portions of said metal layer and said metal leads until said first layer of photosensitive means is exposed; and i. dissolving all of said first layer of photosensitive means.

12. A method as in claim 11 wherein said photosensitive means is photoresist.

13. A method as in claim 11 wherein the thickness of said metal leads is substantially greater than that of said metal layer.

14. A method as in claim 11 wherein said metal leads are deposited by electroplating.

15. A method as in claim 11 wherein said second layer of photosensitive means is dissolved at a faster rate than that of said first layer of photosensitive means.

16. A method as in claim 11 wherein said portions of said metal layer and said metal leads are dissolved concurrently.

17. A method for using photolithographic techniques to fabricate beam leads on a semiconductor device, comprising the steps of:

a. providing a semiconductor wafer having a top, bottom, and side surfaces, said semiconductor wafer having a plurality of semiconductor devices disposed on said top surface thereof, each of said semiconductor devices having metal contacts contacting predetermined regions of said semiconductor device;

b. scribing a line in said top surface of said semiconductors wafer, said scribed line being disposed between predetermined ones of said plurality of semiconductor devices;

c. depositing a protective layer upon said top surface of said semiconductor wafer;

d. depositing a first layer of photosensitive means and photolithographically defining element images at given locations in said first layer of photosensitive means;

e. removing portions of said protective layer in the areas adjacent said defined element images exposing said metal contacts on said top surface of said semiconductor wafer;

f. depositing a metal layer on said layer of photosensitive means, said metal layer contacting said metal contacts adjacent to said element images;

g. depositing metal leads of given geometry upon said metal layer;

h. dissolving portions of said metal layer and said metal leads exposing said first layer of photosensitive means; and i. dissolving said first layer of photosensitive means;

18. The method as in claim 17 wherein said photosensitive means is photoresist.

19. The method as in claim 17 wherein said portions of said metal layer and said metal leads are dissolved concurrently until said metal leads are electrically isolated from each other.

* * * * *